United States Patent
Singh

(10) Patent No.: US 10,568,163 B2
(45) Date of Patent: *Feb. 18, 2020

(54) METHODS OF FAULT DETECTION FOR MULTIPLEXED HEATER ARRAY

(71) Applicant: Lam Research Corporation, Fremont, CA (US)

(72) Inventor: Harmeet Singh, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 523 days.

This patent is subject to a terminal disclaimer.

(21) Appl. No.: 14/290,542

(22) Filed: May 29, 2014

(65) Prior Publication Data
US 2014/0263274 A1    Sep. 18, 2014

Related U.S. Application Data

(63) Continuation of application No. 12/910,347, filed on Oct. 22, 2010, now Pat. No. 8,791,392.

(51) Int. Cl.
| | |
|---|---|
| H05B 3/68 | (2006.01) |
| H05B 3/02 | (2006.01) |
| H05B 1/02 | (2006.01) |
| H01L 21/67 | (2006.01) |

(52) U.S. Cl.
CPC ..... *H05B 1/0233* (2013.01); *H01L 21/67109* (2013.01)

(58) Field of Classification Search
CPC ......... H01L 21/67109; H01L 21/67115; H01L 21/67242; H01L 21/67248; H01L 21/67288; H05B 1/023; H05B 1/0233; H05B 3/74–748; H05B 2213/03; H05B 2213/05; H05B 2213/07
USPC .............. 219/443.1–448.12, 462.1, 482–487
See application file for complete search history.

(56) References Cited

U.S. PATENT DOCUMENTS

| | | | |
|---|---|---|---|
| 3,440,883 A | | 4/1969 | Lightner |
| 3,752,956 A | | 8/1973 | Cahill et al. |
| 5,255,520 A | | 10/1993 | O'Geary et al. |
| 5,414,245 A | | 5/1995 | Hackleman |
| 5,504,471 A | | 4/1996 | Lund |
| 5,515,683 A | | 5/1996 | Kessler |
| 5,536,918 A | | 7/1996 | Ohkase et al. |
| 5,591,269 A | | 1/1997 | Arami et al. |
| 5,616,024 A | * | 4/1997 | Nobori ............ C23C 16/46 219/444.1 |
| 5,635,093 A | | 6/1997 | Arena et al. |

(Continued)

FOREIGN PATENT DOCUMENTS

| | | |
|---|---|---|
| CN | 101131955 A | 2/2008 |
| EP | 1233651 A1 | 8/2002 |

(Continued)

OTHER PUBLICATIONS

Commonly-Owned Utility U.S. Appl. No. 12/582,991, filed Oct. 21, 2009.

(Continued)

*Primary Examiner* — Sang Y Paik

(57) ABSTRACT

Described herein is a method of detecting fault conditions in a multiplexed multi-heater-zone heating plate for a substrate support assembly used to support a semiconductor substrate in a semiconductor processing apparatus.

14 Claims, 7 Drawing Sheets

(56) References Cited

U.S. PATENT DOCUMENTS

| | | | |
|---|---|---|---|
| 5,665,166 A | 9/1997 | Deguchi et al. | |
| 5,667,622 A | 9/1997 | Hasegawa et al. | |
| 5,702,624 A | 12/1997 | Liao et al. | |
| 5,740,016 A | 4/1998 | Dhindsa | |
| 5,802,856 A | 9/1998 | Schaper et al. | |
| 5,851,298 A | 12/1998 | Ishii | |
| 5,886,866 A | 3/1999 | Hausmann | |
| 5,994,675 A | 11/1999 | Bethune et al. | |
| 6,023,052 A * | 2/2000 | Carl, Jr. | G05D 23/1913 219/483 |
| 6,060,697 A | 5/2000 | Morita et al. | |
| 6,091,060 A | 7/2000 | Getchel et al. | |
| 6,095,084 A | 8/2000 | Shamouilian et al. | |
| 6,100,506 A | 8/2000 | Colelli, Jr. et al. | |
| 6,175,175 B1 | 1/2001 | Hull | |
| 6,222,161 B1 | 4/2001 | Shirakawa et al. | |
| 6,227,141 B1 | 5/2001 | Sharan et al. | |
| 6,271,459 B1 | 8/2001 | Yoo | |
| 6,310,755 B1 * | 10/2001 | Kholodenko | C04B 35/185 361/115 |
| 6,311,091 B1 | 10/2001 | Yamahira | |
| 6,353,209 B1 | 3/2002 | Schaper et al. | |
| 6,365,879 B1 | 4/2002 | Kuibira et al. | |
| 6,403,403 B1 | 6/2002 | Mayer et al. | |
| 6,469,283 B1 | 10/2002 | Burkhart et al. | |
| 6,475,336 B1 | 11/2002 | Hubacek | |
| 6,483,690 B1 | 11/2002 | Nakajima et al. | |
| 6,512,207 B1 | 1/2003 | Dress et al. | |
| 6,523,493 B1 | 2/2003 | Brcka | |
| 6,551,445 B1 | 4/2003 | Yokogawa et al. | |
| 6,566,632 B1 | 5/2003 | Katata et al. | |
| 6,612,673 B1 | 9/2003 | Giere et al. | |
| 6,664,515 B2 | 12/2003 | Natsuhara et al. | |
| 6,693,262 B2 | 2/2004 | Gerola et al. | |
| 6,700,101 B2 | 3/2004 | Decesari et al. | |
| 6,739,138 B2 | 5/2004 | Saunders et al. | |
| 6,740,853 B1 | 5/2004 | Johnson et al. | |
| 6,741,446 B2 | 5/2004 | Ennis | |
| 6,746,616 B1 | 6/2004 | Fulford et al. | |
| 6,795,292 B2 | 9/2004 | Grimard et al. | |
| 6,815,365 B2 | 11/2004 | Masuda et al. | |
| 6,825,617 B2 | 11/2004 | Kanno et al. | |
| 6,847,014 B1 | 1/2005 | Benjamin et al. | |
| 6,886,347 B2 | 5/2005 | Hudson et al. | |
| 6,888,106 B2 | 5/2005 | Hiramatsu | |
| 6,913,571 B2 | 7/2005 | Severns | |
| 6,921,724 B2 | 7/2005 | Kamp et al. | |
| 6,956,186 B1 | 10/2005 | Ito et al. | |
| 6,979,805 B2 | 12/2005 | Arthur et al. | |
| 6,985,000 B2 | 1/2006 | Feder | |
| 6,989,210 B2 | 1/2006 | Gore | |
| 7,075,031 B2 | 7/2006 | Strang et al. | |
| 7,141,763 B2 | 11/2006 | Moroz | |
| 7,143,222 B2 | 11/2006 | Fisher et al. | |
| 7,161,121 B1 | 1/2007 | Steger | |
| 7,173,222 B2 | 2/2007 | Cox et al. | |
| 7,175,714 B2 | 2/2007 | Ootsuka et al. | |
| 7,206,184 B2 | 4/2007 | Ennis | |
| 7,230,204 B2 | 6/2007 | Mitrovic et al. | |
| 7,250,309 B2 | 7/2007 | Mak et al. | |
| 7,268,322 B2 | 9/2007 | Kuibira et al. | |
| 7,274,004 B2 | 9/2007 | Benjamin et al. | |
| 7,275,309 B2 | 10/2007 | Matsuda et al. | |
| 7,279,661 B2 | 10/2007 | Okajima et al. | |
| 7,297,894 B1 | 11/2007 | Tsukamoto | |
| 7,311,782 B2 | 12/2007 | Strang et al. | |
| 7,372,001 B2 | 5/2008 | Tachikawa et al. | |
| 7,396,413 B2 | 7/2008 | Sedenszki et al. | |
| 7,396,431 B2 | 7/2008 | Chen et al. | |
| 7,415,312 B2 | 8/2008 | Barnett, Jr. et al. | |
| 7,475,551 B2 | 1/2009 | Ghoshal | |
| 7,480,129 B2 | 1/2009 | Brown et al. | |
| 7,501,605 B2 | 3/2009 | Steger et al. | |
| 7,504,006 B2 | 3/2009 | Gopalraja et al. | |
| 7,718,932 B2 | 5/2010 | Steger | |
| 7,782,583 B2 | 8/2010 | Moon | |
| 7,893,387 B2 | 2/2011 | Ohata | |
| 7,940,064 B2 | 5/2011 | Segawa et al. | |
| 7,952,049 B2 | 5/2011 | Tsukamoto | |
| 7,968,825 B2 | 6/2011 | Jyousaka et al. | |
| 8,057,602 B2 | 11/2011 | Koelmel et al. | |
| 8,222,574 B2 | 7/2012 | Sorabji et al. | |
| 8,315,510 B2 | 11/2012 | Ueshima et al. | |
| 8,546,732 B2 | 10/2013 | Singh | |
| 8,637,794 B2 | 1/2014 | Singh et al. | |
| 8,791,392 B2 * | 7/2014 | Singh | 219/446.1 |
| 8,884,194 B2 | 11/2014 | Singh et al. | |
| 9,307,578 B2 | 4/2016 | Pease | |
| 2002/0043528 A1 | 4/2002 | Ito | |
| 2002/0159216 A1 | 10/2002 | Ennis | |
| 2002/0185488 A1 | 12/2002 | Natsuhara et al. | |
| 2003/0160041 A1 | 8/2003 | Hiramatsu | |
| 2004/0195229 A1 | 10/2004 | Szekeresch et al. | |
| 2004/0222210 A1 | 11/2004 | Lin et al. | |
| 2005/0007136 A1 | 1/2005 | Feder et al. | |
| 2005/0016465 A1 | 1/2005 | Ramaswamy et al. | |
| 2005/0016987 A1 | 1/2005 | Hiramatsu | |
| 2005/0056635 A1 | 3/2005 | Suzuki et al. | |
| 2005/0095776 A1 | 5/2005 | Usuami | |
| 2005/0215073 A1 | 9/2005 | Nakamura et al. | |
| 2005/0229854 A1 | 10/2005 | Moroz | |
| 2006/0065367 A1 | 3/2006 | Chen et al. | |
| 2006/0191637 A1 | 8/2006 | Zajac et al. | |
| 2006/0226123 A1 | 10/2006 | Birang | |
| 2007/0000918 A1 * | 1/2007 | Steinhauser | A47J 37/0676 219/685 |
| 2007/0056953 A1 | 3/2007 | Awazu et al. | |
| 2007/0062929 A1 | 3/2007 | Mikumo et al. | |
| 2007/0125762 A1 | 6/2007 | Cui et al. | |
| 2007/0138161 A1 | 6/2007 | Yamakawa | |
| 2007/0209933 A1 | 9/2007 | Yoshioka et al. | |
| 2008/0029195 A1 | 2/2008 | Lu | |
| 2008/0049374 A1 | 2/2008 | Morioka et al. | |
| 2008/0092818 A1 | 4/2008 | Fink et al. | |
| 2008/0202924 A1 | 8/2008 | Bluck et al. | |
| 2009/0000738 A1 | 1/2009 | Benjamin | |
| 2009/0031955 A1 | 2/2009 | Lu et al. | |
| 2009/0173445 A1 | 7/2009 | Yeom et al. | |
| 2009/0183677 A1 | 7/2009 | Tian et al. | |
| 2009/0215201 A1 | 8/2009 | Benjamin et al. | |
| 2010/0044364 A1 | 2/2010 | Mikumo et al. | |
| 2010/0055881 A1 | 3/2010 | Shimizu | |
| 2010/0078424 A1 | 4/2010 | Tsukamoto et al. | |
| 2010/0116788 A1 | 5/2010 | Singh et al. | |
| 2010/0163546 A1 | 7/2010 | Nanno et al. | |
| 2010/0257871 A1 | 10/2010 | Venkatasubramanian et al. | |
| 2010/0283565 A1 | 11/2010 | Blakes | |
| 2011/0005682 A1 | 1/2011 | Savas et al. | |
| 2011/0033175 A1 | 2/2011 | Kasai et al. | |
| 2011/0092072 A1 | 4/2011 | Singh et al. | |
| 2011/0143462 A1 | 6/2011 | Gaff et al. | |
| 2013/0068750 A1 | 3/2013 | Gaff et al. | |
| 2013/0220989 A1 | 8/2013 | Pease et al. | |
| 2014/0045337 A1 | 2/2014 | Singh et al. | |
| 2014/0096909 A1 | 4/2014 | Singh et al. | |
| 2015/0170977 A1 | 6/2015 | Singh | |

FOREIGN PATENT DOCUMENTS

| | | |
|---|---|---|
| JP | 601918 A | 1/1985 |
| JP | 621176 A | 1/1987 |
| JP | S62-98610 A | 5/1987 |
| JP | 06010391 | 3/1994 |
| JP | 7-78668 | 3/1995 |
| JP | H7-78668 A | 3/1995 |
| JP | H8-130184 A | 5/1996 |
| JP | H11-126743 A | 5/1999 |
| JP | 2000236015 A | 8/2000 |
| JP | 2000-332089 A | 11/2000 |
| JP | 2001-57370 A | 2/2001 |
| JP | 2001102157 A | 4/2001 |
| JP | 2001-126743 A | 5/2001 |
| JP | 2002-059579 A | 2/2002 |
| JP | 2002538501 A | 11/2002 |

(56) References Cited

FOREIGN PATENT DOCUMENTS

| | | |
|---|---|---|
| JP | 2003-224056 A | 8/2003 |
| JP | 2003-524885 A | 8/2003 |
| JP | 2004152913 A | 5/2004 |
| JP | 2004-303736 A | 10/2004 |
| JP | 2004-319953 A | 11/2004 |
| JP | 2005-026120 A | 1/2005 |
| JP | 2005123286 A | 5/2005 |
| JP | 2005-150370 A | 6/2005 |
| JP | 2005-294237 A | 10/2005 |
| JP | 2006526289 A | 11/2006 |
| JP | 2007081160 A | 3/2007 |
| JP | 2007082374 A | 3/2007 |
| JP | 2007-242913 A | 9/2007 |
| JP | 2009267256 A | 11/2009 |
| JP | 2010153730 A | 7/2010 |
| KR | 201998028601 U | 8/1998 |
| KR | 20050040729 A | 5/2005 |
| KR | 1020050053464 A | 6/2005 |
| KR | 20050121913 A | 12/2005 |
| KR | 1020060067552 A | 6/2006 |
| KR | 20080058109 A | 6/2008 |
| WO | WO-01/11919 A1 | 2/2001 |
| WO | WO-01/24581 A1 | 4/2001 |
| WO | WO-2008/112673 A2 | 9/2008 |

OTHER PUBLICATIONS

Commonly-Owned Utility U.S. Appl. No. 12/943,492, filed Nov. 10, 2010.
Commonly-Owned Utility U.S. Appl. No. 13/234,473, filed Sep. 16, 2011.
Commonly-Owned Utility U.S. Appl. No. 13/237,444, filed Sep. 20, 2011.
Commonly-Owned Utility U.S. Appl. No. 13/238,396, filed Sep. 21, 2011.
International Search Report and Written Opinion dated May 7, 2012 for PCT/US2011/053558.
Ayars, Eric, "Bandgap in a Semiconductor Diode", Advanced and Intermediate Instructional Labs Workshop, AAPT Summer Meeting, California State university, Chicago, Jul. 20, 2008 http://phys.csuchico.edu/-eayars/publications/bandgap.pdf.
Japanese Non-Final Rejection dated May 19, 2015 in corresponding Japanese Application No. 2013-534926 filed on Sep. 28, 2011 (7 pages).
Notification of examination Opinions issued by the Taiwanese Patent Office dated Aug. 6, 2015 in corresponding Taiwanese Patent Application No. 100132308, with full English translation (5 pages).
Office Action (Notification of the Final Office Action) dated Apr. 26, 2016, by the Korean Patent Office in corresponding Korean Patent Application No. 10-2013-7012033, and a Partial English Translation of the Office Action. (5 pages).
International Search Report and Written Opinion dated Jul. 28, 2011 for PCT/US2010/002794.
Notification of Examination Opinions dated Nov. 27, 2014 for Taiwan Patent Appln No. 99135939.
An English Translation of the Office Action (Examination Report) dated Feb. 12, 2015, by the Intellectual Property Office of Singapore in the Singapore Patent Application No. 201202977-3 (10 pages).
Office Action (Notification of Reason(s) for Rejection) dated Apr. 7, 2015, by the Japanese Patent Office in the Japanese Patent Application No. 2012-535190, and an English Translation of the Office Action (4 pages).
Office Action (Notification of Examination Opinions) dated Jan. 11, 2016, by the Taiwanese Patent Office in he Taiwanese Patent Application No. 104128381, and an English Translation of the Office Action (9 pages).
Office Action (Notification of Reason(s) for Rejection) dated Jan. 26, 2016, by the Japanese Patent Office in he Japanese Patent Application No. 2015-216245, and an English Translation of the Office Action (6 pages).
Office Action dated Mar. 15, 2017 by the Japanese Patent Office in the Japanese Patent Application No. 2016-084104, and an English Translation of the Office Action (8 pages).

* cited by examiner

METHODS OF FAULT DETECTION FOR MULTIPLEXED HEATER ARRAY

CROSS REFERENCE TO RELATED APPLICATIONS

This application is a continuation of U.S. patent application Ser. No. 12/910,347, filed Oct. 22, 2010, entitled METHODS OF FAULT DETECTION FOR MULTIPLEXED HEATER ARRAY, the entire content of which is hereby incorporated by reference.

BACKGROUND

With each successive semiconductor technology generation, substrate diameters tend to increase and transistor sizes decrease, resulting in the need for an ever higher degree of accuracy and repeatability in substrate processing. Semiconductor substrate materials, such as silicon substrates, are processed by techniques which include the use of vacuum chambers. These techniques include non-plasma applications such as electron beam deposition, as well as plasma applications, such as sputter deposition, plasma-enhanced chemical vapor deposition (PECVD), resist strip, and plasma etch.

Plasma processing systems available today are among those semiconductor fabrication tools which are subject to an increasing need for improved accuracy and repeatability. One metric for plasma processing systems is improved uniformity, which includes uniformity of process results on a semiconductor substrate surface as well as uniformity of process results of a succession of substrates processed with nominally the same input parameters. Continuous improvement of on-substrate uniformity is desirable. Among other things, this calls for plasma chambers with improved uniformity, consistency and self diagnostics.

A heating plate for a substrate support assembly in a semiconductor processing apparatus with multiple independently controllable planar heater zones is disclosed in commonly-owned U.S. patent application Ser. No. 12/582,991, the disclosure of which is hereby incorporated by reference. This heating plate comprises a scalable multiplexing layout scheme of the planar heater zones and the power supply and power return lines. By tuning the power of the planar heater zones, the temperature profile during processing can be shaped both radially and azimuthally. Although this heating plate is primarily described for a plasma processing apparatus, this heating plate can also be used in other semiconductor processing apparatuses that do not use plasma. To prevent overheating in the heating zones, a fault detection system would be desirable.

SUMMARY OF THE INVENTION

Described herein is a method of fault detection for a multi-zone heating plate in a substrate support assembly used to support a semiconductor substrate in a semiconductor processing apparatus, the heating plate comprising a plurality of planar heater zones, a plurality of power supply lines and a plurality of power return lines, wherein each planar heater zone is connected to one of the power supply lines and one of the power return lines, and no two planar heater zones share the same pair of power supply line and power return line; the method comprising: (a) obtaining a measured total heating power of one or more planar heater zones; (b) comparing the measured total heating power to a pre-established total heating power of the one or more planer heater zones; (c) if the measured total heating power deviates from the pre-established total heating power by a pre-determined margin, triggering an alarm signal.

DETAILED DESCRIPTION

Figure 1:
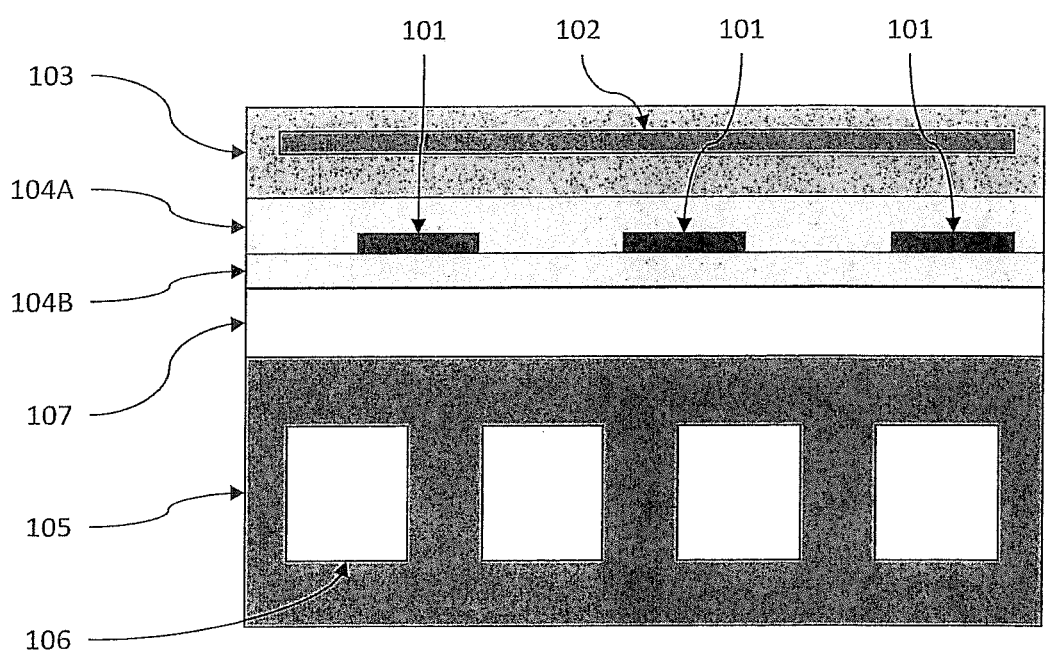
FIG. 1 is a schematic of the cross-sectional view of a substrate support assembly in which a heating plate with an array of planar heater zones is incorporated, the substrate support assembly also comprising an electrostatic chuck (ESC).

Radial and azimuthal substrate temperature control in a semiconductor processing apparatus to achieve desired critical dimension (CD) uniformity on the substrate is becoming more demanding. Even a small variation of temperature may affect CD to an unacceptable degree, especially as CD approaches sub-100 nm in semiconductor fabrication processes.

A substrate support assembly may be configured for a variety of functions during processing, such as supporting the substrate, tuning the substrate temperature, and supplying radio frequency power. The substrate support assembly can comprise an electrostatic chuck (ESC) useful for electrostatically clamping a substrate onto the substrate support assembly during processing. The ESC may be a tunable ESC (T-ESC). A T-ESC is described in commonly assigned U.S. Pat. Nos. 6,847,014 and 6,921,724, which are hereby incorporated by reference. The substrate support assembly may comprise a ceramic substrate holder, a fluid-cooled heat sink (hereafter referred to as cooling plate) and a plurality of concentric planar heater zones to realize step by step and radial temperature control. Typically, the cooling plate is maintained between −20° C. and 80° C. The heaters are located on the cooling plate with a layer of thermal insulator in between. The heaters can maintain the support surface of the substrate support assembly at temperatures about 0° C. to 90° C. above the cooling plate temperature. By changing the heater power within the plurality of planar heater zones, the substrate support temperature profile can be changed between center hot, center cold, and uniform. Further, the mean substrate support temperature can be changed step by step within the operating range of 0 to 90° C. above the cooling plate temperature. A small azimuthal temperature variation poses increasingly greater challenges as CD decreases with the advance of semiconductor technology.

Controlling temperature is not an easy task for several reasons. First, many factors can affect heat transfer, such as the locations of heat sources and heat sinks, the movement, materials and shapes of the media. Second, heat transfer is a dynamic process. Unless the system in question is in heat equilibrium, heat transfer will occur and the temperature profile and heat transfer will change with time. Third, non-equilibrium phenomena, such as plasma, which of course is always present in plasma processing, make theoretical prediction of the heat transfer behavior of any practical plasma processing apparatus very difficult.

The substrate temperature profile in a plasma processing apparatus is affected by many factors, such as the plasma density profile, the RF power profile and the detailed structure of the various heating the cooling elements in the chuck, hence the substrate temperature profile is often not uniform and difficult to control with a small number of heating or cooling elements. This deficiency translates to non-uniformity in the processing rate across the whole substrate and non-uniformity in the critical dimension of the device dies on the substrate.

In light of the complex nature of temperature control, it would be advantageous to incorporate multiple independently controllable planar heater zones in the substrate support assembly to enable the apparatus to actively create and maintain the desired spatial and temporal temperature profile, and to compensate for other adverse factors that affect CD uniformity.

A heating plate for a substrate support assembly in a semiconductor processing apparatus with multiple independently controllable planar heater zones is disclosed in commonly-owned U.S. patent application Ser. No. 12/582,991, the disclosure of which is hereby incorporated by reference. This heating plate comprises a scalable multiplexing layout scheme of the planar heater zones and the power supply and power return lines. By tuning the power of the planar heater zones, the temperature profile during processing can be shaped both radially and azimuthally. Although this heating plate is primarily described for a plasma processing apparatus, this heating plate can also be used in other semiconductor processing apparatuses that do not use plasma.

The planar heater zones in this heating plate are preferably arranged in a defined pattern, for example, a rectangular grid, a hexagonal grid, a polar array, concentric rings or any desired pattern. Each planar heater zone may be of any suitable size and may have one or more heater elements. All heater elements in a planar heater zone are turned on or off together. To minimize the number of electrical connections, power supply lines and power return lines are arranged such that each power supply line is connected to a different group of planar heater zones, and each power return line is connected to a different group of planar heater zones wherein each planar heater zone is in one of the groups connected to a particular power supply line and one of the groups connected to a particular power return line. No two planar heater zones are connected to the same pair of power supply and power return lines. Thus, a planar heater zone can be activated by directing electrical current through a pair of power supply and power return lines to which this particular planar heater zone is connected. The power of the heater elements is preferably smaller than 20 W, more preferably 5 to 10 W. The heater elements may be resistive heaters, such as polyimide heaters, silicone rubber heaters, mica heaters, metal heaters (e.g. W, Ni/Cr alloy, Mo or Ta), ceramic heaters (e.g. WC), semiconductor heaters or carbon heaters. The heater elements may be screen printed, wire wound or etched foil heaters. In one embodiment, each planar heater zone is not larger than four device dies being manufactured on a semiconductor substrate, or not larger than two device dies being manufactured on a semiconductor substrate, or not larger than one device die being manufactured on a semiconductor substrate, or from 16 to 100 $cm^2$ in area, or from 1 to 15 $cm^2$ in area, or from 2 to 3 $cm^2$ in area to correspond to the device dies on the substrate. The thickness of the heater elements may range from 2 micrometers to 1 millimeter, preferably 5-80 micrometers. To allow space between planar heater zones and/or power supply and power return lines, the total area of the planar heater zones may be up to 90% of the area of the upper surface of the substrate support assembly, e.g. 50-90% of the area. The power supply lines or the power return lines (power lines, collectively) may be arranged in gaps ranging from 1 to 10 mm between the planar heater zones, or in separate planes separated from the planar heater zones plane by electrically insulating layers. The power supply lines and the power return lines are preferably made as wide as the space allows, in order to carry large current and reduce Joule heating. In one embodiment, in which the power lines are in the same plane as the planar heater zones, the width of the power lines is preferably between 0.3 mm and 2 mm. In another embodiment, in which the power lines are on different planes than the planar heater zones, the width of the power lines can be as large as the planar heater zones, e.g. for a 300 mm chuck, the width can be 1 to 2 inches. The materials of the power lines may be the same as or different from the materials of the heater elements. Preferably, the materials of the power lines are materials with low resistivity, such as Cu, Al, W, Inconel® or Mo.

FIG. 1 shows a substrate support assembly comprising one embodiment of the heating plate having an array of planar heater zones 101 incorporated in two electrically insulating layers 104A and 104B. The electrically insulating layers may be a polymer material, an inorganic material, a ceramic such as silicon oxide, alumina, yttria, aluminum nitride or other suitable material. The substrate support assembly further comprises (a) an ESC having a ceramic layer 103 (electrostatic clamping layer) in which an electrode 102 (e.g. monopolar or bipolar) is embedded to electrostatically clamp a substrate to the surface of the ceramic layer 103 with a DC voltage, (b) a thermal barrier layer 107, (c) a cooling plate 105 containing channels 106 for coolant flow.

Figure 2:
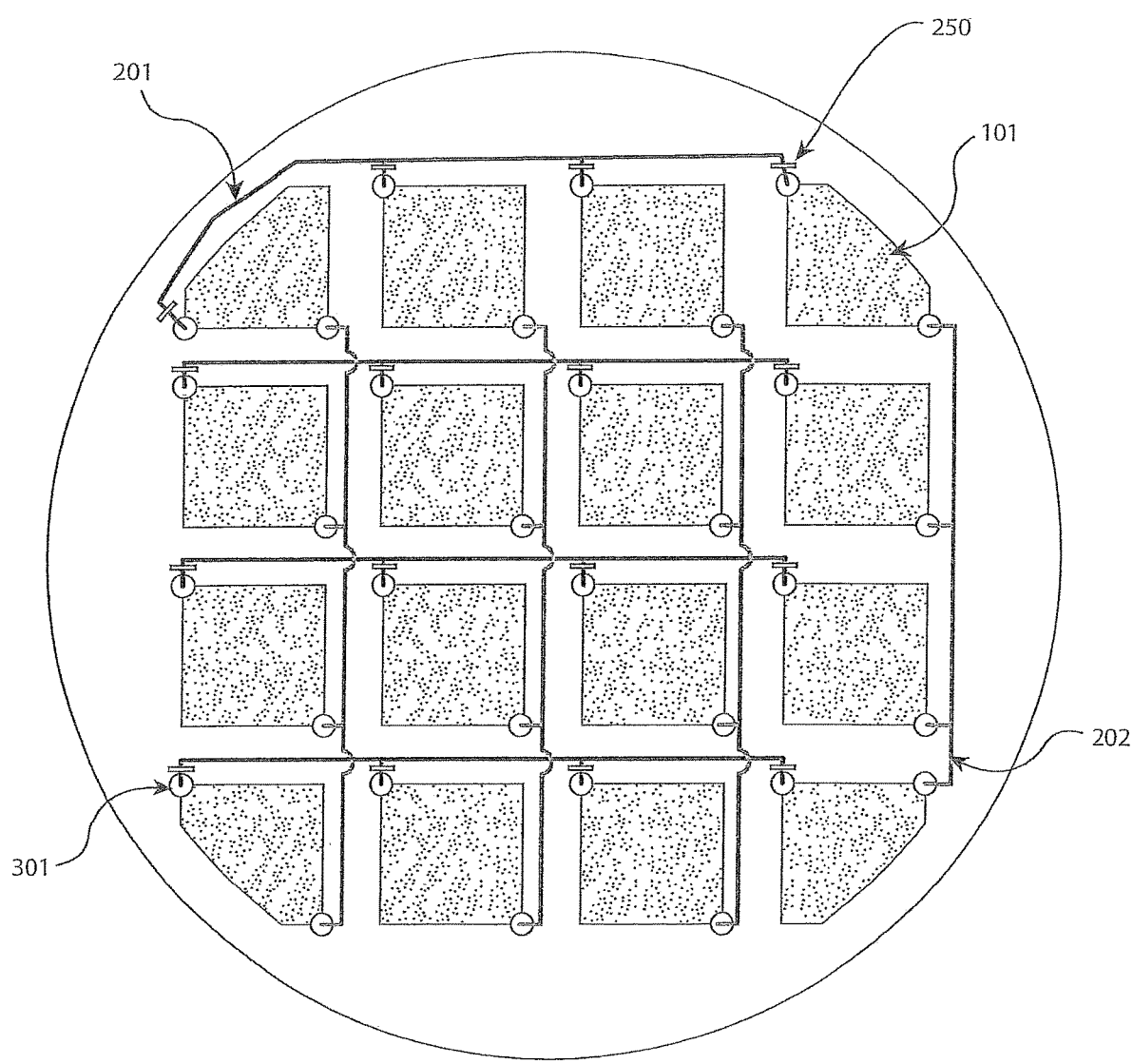
FIG. 2 illustrates the electrical connection from power supply lines and power return lines to an array of planar heater zones in the heating plate.

As shown in FIG. 2, each of the planar heater zones 101 is connected to one of the power supply lines 201 and one of the power return lines 202. No two planar heater zones 101 share the same pair of power supply line 201 and power return line 202. By suitable electrical switching arrangements, it is possible to connect a pair of power supply 201 and power return 202 lines to a power supply (not shown), whereby only the planar heater zone connected to this pair of lines is turned on. The time-averaged heating power of each planar heater zone can be individually tuned by time-domain multiplexing. In order to prevent crosstalk between different planar heater zones, a diode 250 is serially connected between each planar heater zone 101 and the power supply line 201 connected thereto (as shown in FIG. 2), or between each planar heater zone 101 and the power return line 202 connected thereto (not shown) such that the diode 250 does not allow electrical current flow in a direction from the power return line 201 through the planar heater zone 101 to the power supply line 201. The diode 250 is physically located in or adjacent the planar heater zone.

A substrate support assembly can comprise an embodiment of the heating plate, wherein each planar heater zone of the heating plate is of similar size to or smaller than a single device die or group of device dies on the substrate so that the substrate temperature, and consequently the plasma etching process, can be controlled for each device die position to maximize the yield of devices from the substrate. The heating plate can include 10-100, 100-200, 200-300 or more planar heating zones. The scalable architecture of the heating plate can readily accommodate the number of planar heater zones required for die-by-die substrate temperature control (typically more than 100 dies on a substrate of 300-mm diameter and thus 100 or more heater zones) with minimal number of power supply lines, power return lines, and feedthroughs in the cooling plate, thus reduces disturbance to the substrate temperature, the cost of manufacturing and complexity of the substrate support assembly. Although not shown, the substrate support assembly can comprise features such as lift pins for lifting the substrate, helium back cooling, temperature sensors for providing temperature feedback signals, voltage and current sensors for providing heating power feedback signals, power feed for heaters and/or clamp electrode, and/or RF filters.

Figure 3:
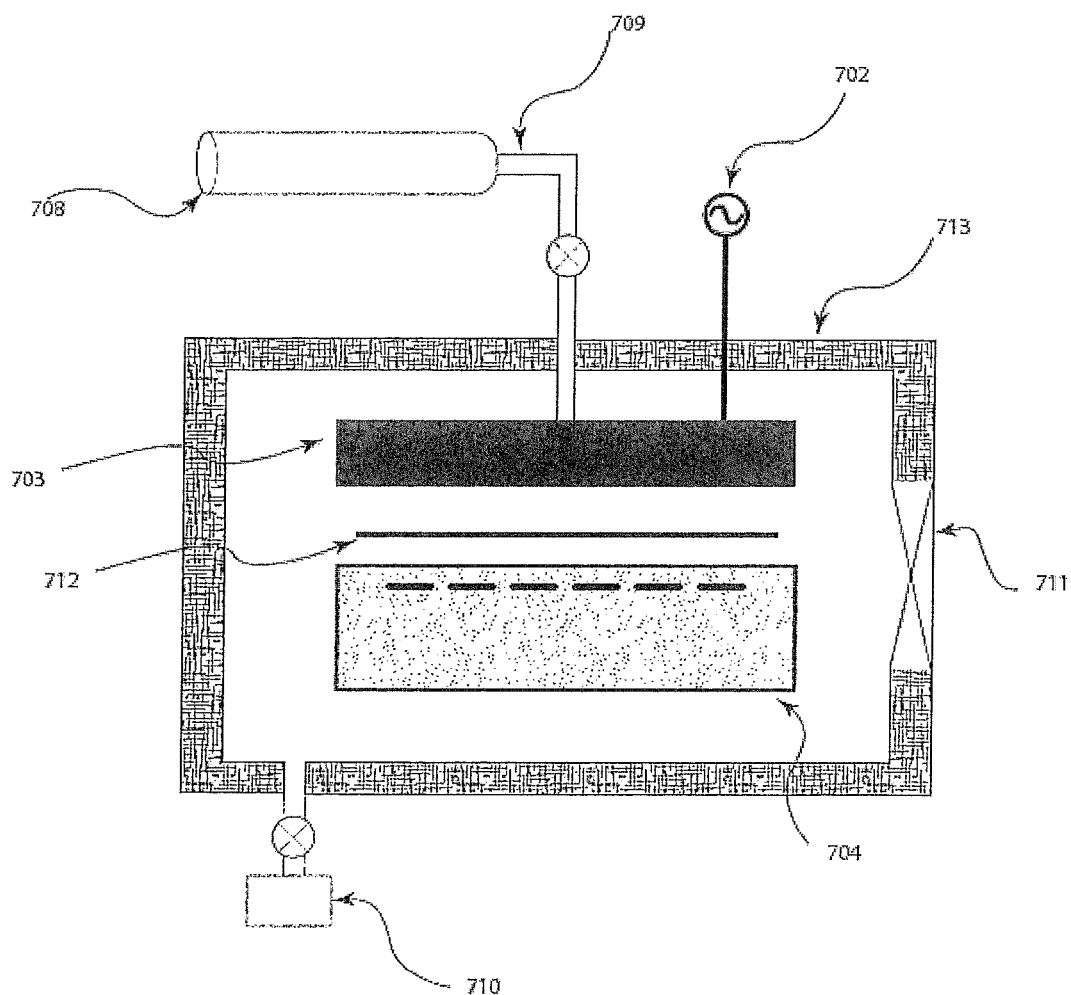
FIG. 3 is a schematic of an exemplary plasma processing chamber, which can include the substrate support assembly of FIG. 1.

As an overview of how a plasma processing chamber operates, FIG. 3 shows a schematic of a plasma processing chamber comprising a chamber 713 in which an upper showerhead electrode 703 and a substrate support assembly 704 are disposed. A substrate (e.g., 300 mm wafer) 712 is loaded through a loading port 711 onto the substrate support assembly 704. A gas line 709 supplies process gas to the upper showerhead electrode 703 which delivers the process gas into the chamber. A gas source 708 (e.g. a mass flow controller "MFC" supplying a suitable gas mixture) is connected to the gas line 709. A RF power source 702 is connected to the upper showerhead electrode 703. In operation, the chamber is evacuated by a vacuum pump 710 and the RF power is capacitively coupled between the upper showerhead electrode 703 and a lower electrode in the substrate support assembly 704 to energize the process gas into a plasma in the space between the substrate 712 and the upper showerhead electrode 703. The plasma can be used to etch device die features into layers on the substrate 712. The substrate support assembly 704 may have heaters incorporated therein as disclosed above. It should be appreciated that while the detailed design of the plasma processing chamber may vary, RF power is coupled to the plasma through the substrate support assembly 704.

Electrical power supplied to each planar heater zone 101 can be adjusted based on the actual temperature thereof in order to achieve a desired substrate support temperature profile. The actual temperature at each planar heater zone 101 can be monitored by measuring a reverse saturation current of the diode 250 connected thereto. The actual temperature at each planar heater zone 101 can also be monitored by thermocouples or fluoro-optic temperature sensors at each planar heater zone.

A method of fault detection for the heating plate according to an embodiment, comprises: (a) obtaining a measured total heating power of one or more planar heater zones; (b) comparing the measured total heating power to a pre-established total heating power of the one or more planer heater zones; (c) if the measured total heating power deviates from the pre-established total heating power by a pre-determined margin, triggering an alarm signal. The pre-determined margin can be, for example, ±20%, ±10%, ±5%, or ±1% of the pre-established total heating power. During processing of a semiconductor substrate, the alarm signal can be used to trigger a recalibration test or a power adjustment to the heating zone triggering the alarm.

A measured heating power of each of the one or more planar heater zones in step (a) can be obtained by measuring a voltage V across that planar heater zone, measuring a current I flowing through that planar heater zone and multiplying V by I. The measured total heating power in step (a) is a sum of the measured heating power of each of the one or more planar heater zones. The voltage measurement can be carried out with a voltmeter or other suitable voltage measuring device and the current measurement can be obtained using an ammeter or other suitable current measuring device.

Figure 4:
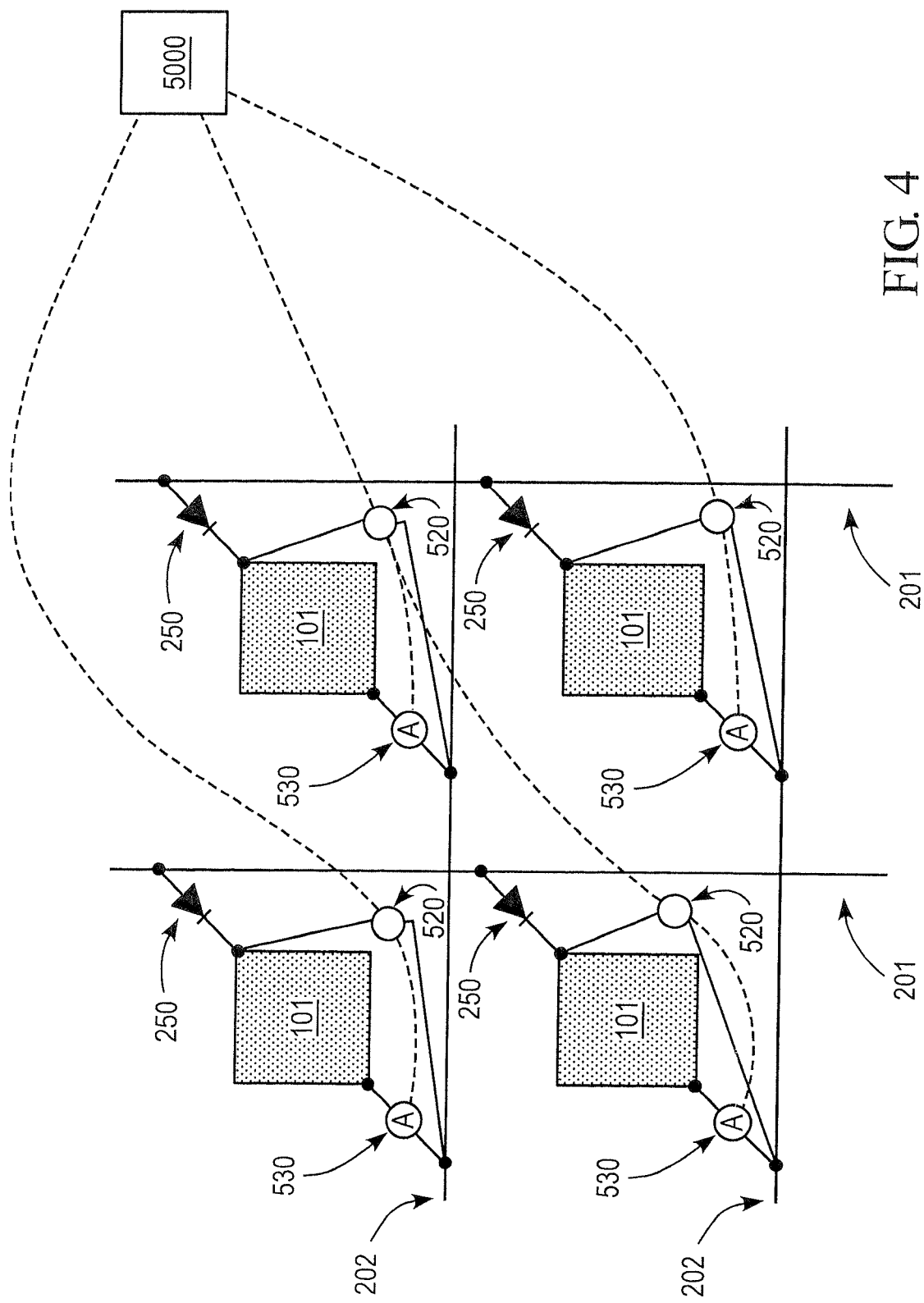
FIG. 4 shows electrical connections of voltmeters and ammeters to the heating plate according to one embodiment.

As shown in FIG. 4, the heating plate can have a voltmeter 520 (or other suitable voltage measuring device) connected between the power supply line 201 and return line 202 connected to a heating zone 101, and an ammeter 530 (or other suitable current measuring device) is serially connected between each planar heater zone 101 and the power return line 202 or the power supply line 201 connected thereto. A processor 5000 (e.g. a computer, a micro-controller, etc.) is operable to take a voltage reading from each voltmeter 520 and take a current reading from each ammeter 530. In a heating plate with an N-by-M array of heater zones, N power supply lines and M power return lines, N×M ammeters and N×M voltmeters are needed. A method of fault detection comprises: (a) while a planar heater zone is powered, obtaining a measured heating power of the planar heater zone by measuring a voltage V across the planar heater zone, preferably using the voltmeter 520 connected thereto, and measuring a current I flowing through the planar heater zone, preferably using the ammeter 530 connected thereto, and multiplying V by I; (b) comparing the measured heating power of the planar heater zone to a pre-established heating power of the planer heater zone; (c) if the measured heating power deviates from the pre-established heating power by a pre-determined margin, triggering an alarm signal.

Figure 5:
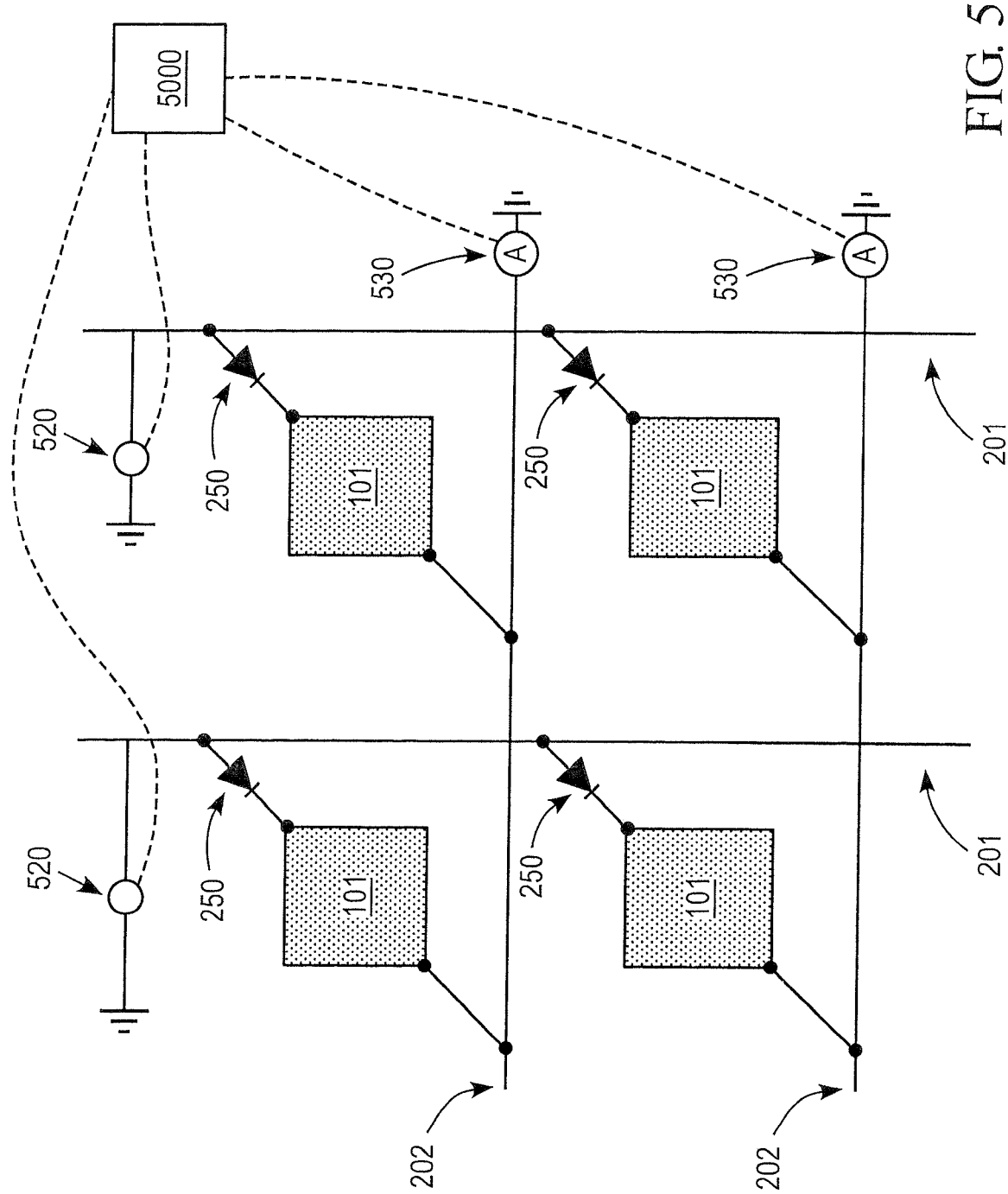
FIG. 5 shows electrical connections of voltmeters and ammeters to the heating plate according to another embodiment.

Alternatively, as shown in FIG. 5, a voltmeter 520 is connected to each power supply line 201; an ammeter 530 is serially connected to each power return line 202 such that when any power return line 202 is connected to an electrical ground, the ammeter 530 is between the power return line 202 and the electrical ground. A processor 5000 is operable to take a voltage reading from each voltmeter 520 and take a current reading from each ammeter 530. In a heating plate with an N-by-M array of heater zones, N power supply lines and M power return lines, N voltmeters and M ammeters are needed. A method of fault detection comprises: (a) while one or more power supply lines 201 are connected to a power source, and at least one power return line 202 is connected to an electrical ground, obtaining a measured total heating power of the planar heater zones connected to the one or more power supply lines 201 and the at least one power return line 202, by measuring a voltage V on the one or more power supply lines 201, preferably using at least one of the voltmeters 520 connected thereto, and measuring a total current I carried by at least one power return line 202, preferably using the ammeter 530 connected thereto, and multiplying V by I; (b) comparing the measured total heating power to a pre-established total heating power calculated by summing a pre-established heating power of each of the planar heater zones connected to the one or more power supply lines 201 and the at least one power return line 202; (c) if the measured total heating power deviates from the pre-established total heating power by a pre-determined margin, triggering an alarm signal.

Figure 6:
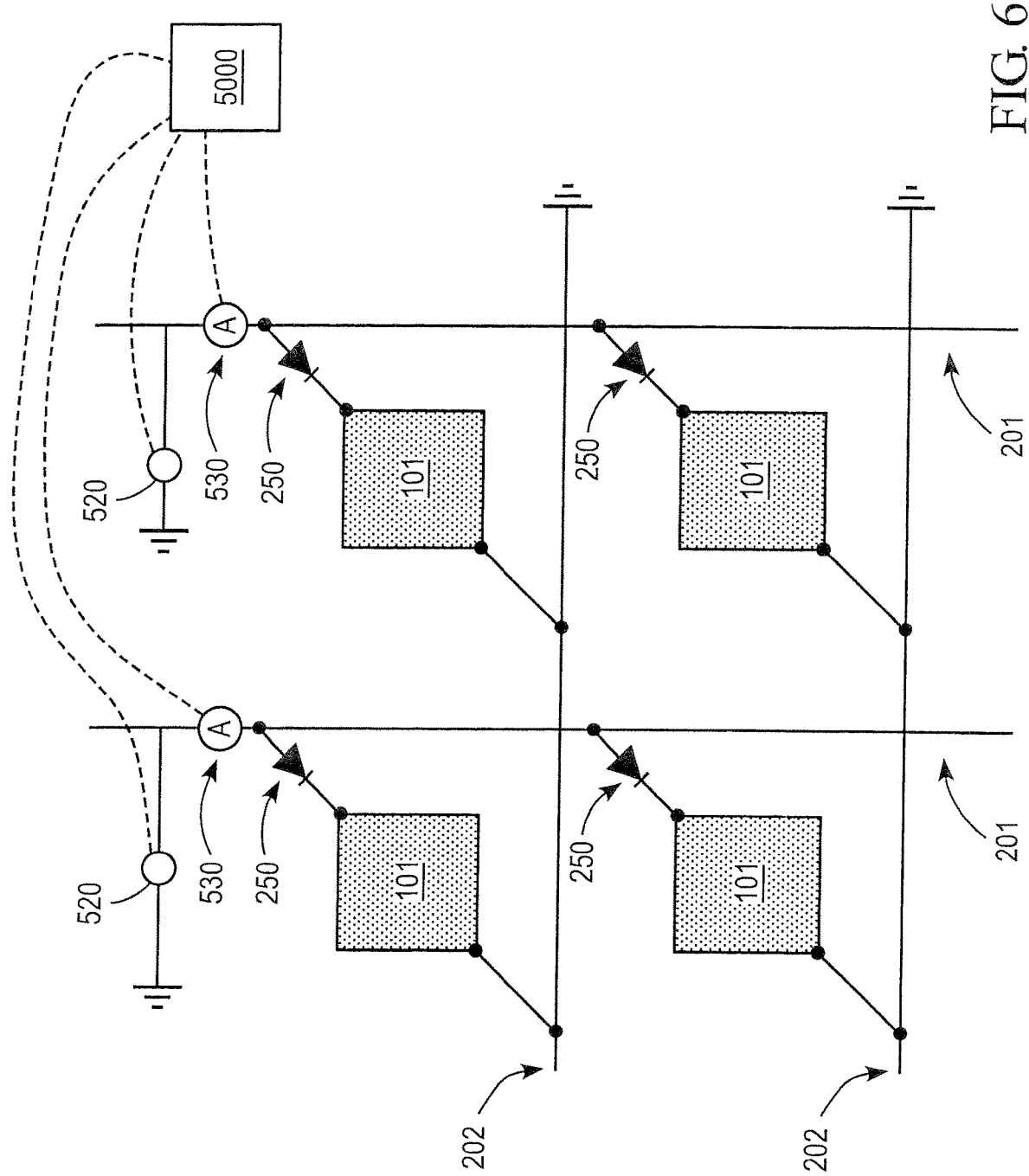
FIG. 6 shows electrical connections of voltmeters and ammeters to the heating plate according to yet another embodiment.

Alternatively, as shown in FIG. 6, a voltmeter 520 is connected to each power supply line 201; an ammeter 530 is serially connected to each power supply line 201 such that when any power supply line 201 is connected to a power source, all electrical current carried by that power supply line 201 flows through the ammeter 530 connected thereto before flowing into any planar heater zones 101. A processor 5000 is operable to take a voltage reading from each voltmeter 520 and take a current reading from each ammeter 530. In a heating plate with an N-by-M array of heater zones, N power supply lines and M power return lines, N voltmeters and N ammeters are needed. A method of fault detection comprises: (a) while one or more power return lines 202 are connected to an electrical ground, and at least one power supply line 201 is connected to a power source, obtaining a measured total heating power of the planar heater zones connected to the one or more power return lines 202 and the at least one power supply line 201, by measuring a voltage V on the at least one power supply line 201, preferably using the voltmeter 520 connected thereto, measuring a current I on at least one power supply line 201, preferably using the ammeter 530 connected thereto, and multiplying V by I; (b) comparing the measured total heating power to a pre-established total heating power calculated by summing a pre-established heating power of each of the planar heater zones connected to the one or more power return lines 202 and the at least one power supply line 201; (c) if the measured total heating power deviates from the pre-established total heating power by a pre-determined margin, triggering an alarm signal.

Figure 7:
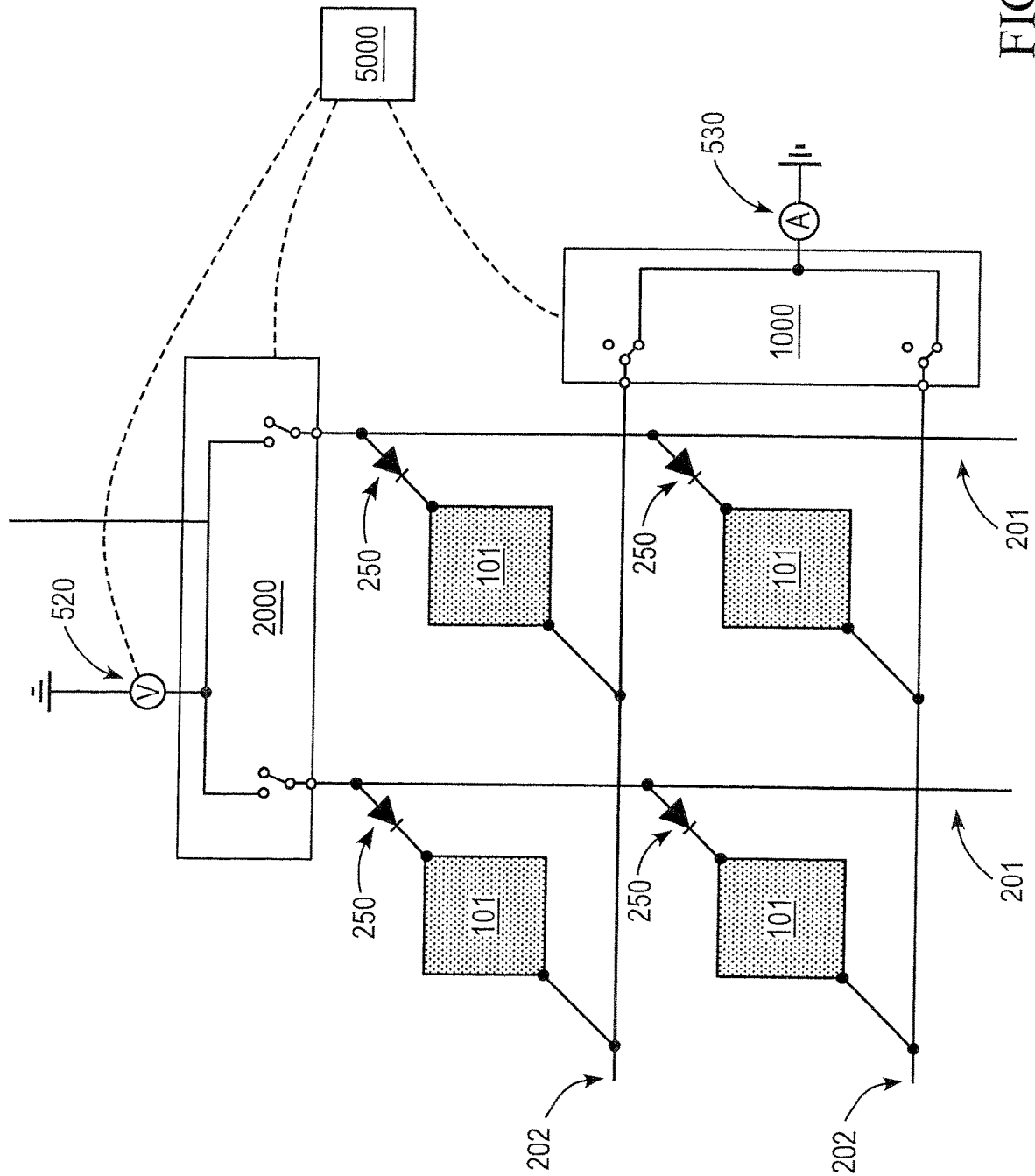
FIG. 7 shows electrical connections of a voltmeter, an ammeter and two multiplexers to the heating plate.

Alternatively as shown in FIG. 7, a multiplexer 1000 is configured to connect each power return line 202 selectively to an electrical ground through an ammeter 530, an electrically isolated terminal, independent of the other power return lines; a multiplexer 2000 is configured to selectively connect each power supply line 201 to an electrically isolated terminal, independent of the other power supply lines. A processor 5000 is operable to take a voltage reading from the voltmeter 520 and take a current reading from the ammeter 530, and controls the multiplexers 1000 and 2000. In a heating plate with an N-by-M array of heater zones, N power supply lines and M power return lines, only one voltmeter and one ammeter are needed. A method of fault detection comprises: (a) while all power return lines 202 are connected to the electrical ground through the ammeter 530 and only the i-th power supply line 201 is connected to the power source, obtaining a measured total heating power of all the planar heater zones connected to the i-th power supply line 201, by measuring a voltage V on the i-th power supply line 201, preferably using the voltmeter 520, measuring a total current I on all the power return lines 202, preferably using the ammeter 530, and multiplying V by I; (b) comparing the total heating power to a pre-established total heating power calculated by summing a pre-established heating power of each of the planar heater zones connected to the i-th power supply line 201; (c) if the measured total heating power deviates from the pre-established total heating power by a pre-determined margin, triggering an alarm signal; (d) while all power supply lines 201 are connected to the power source and only the j-th power return line 202 is connected to the electrical ground, obtaining a total heating power of all the planar heater zones connected to the j-th power return line 202, measuring a voltage V on all the power supply lines 201, preferably using the voltmeter 520, measuring a current I on the j-th power return line 202, preferably using the ammeter 530, and multiplying V by I; (e) comparing the measured total heating power to a pre-established total heating power calculated by summing a pre-established heating power of each of the planar heater zones connected to the j-th power return line; (f) if the measured total heating power deviates from the pre-established total heating power by a pre-determined margin, triggering an alarm signal. This method can further identify which planar heater zone is in a fault condition: if an alarm signal is triggered when only the i-th power supply line 201 is connected to the power source and all the power return lines 202 are connected to the electrical ground, and when only the j-th power return line 202 is connected to the electrical ground and all the power supply lines 201 are connected to the power source, the planar heater zone connected to both the i-th power supply line 201 and the j-th power return line 202 is in a fault condition.

A measurement error can be rectified by subtracting voltage drop that is not on a planar heater zone, such as voltage drop on power supply lines 201, power return lines 202 and/or the diodes 250 from a voltage V measured on a power supply line 201.

While methods of fault detection for a heating plate for a substrate support assembly in a semiconductor processing apparatus with multiple independently controllable planar heater zones have been described in detail with reference to specific embodiments thereof, it will be apparent to those skilled in the art that various changes and modifications can be made, and equivalents employed, without departing from the scope of the appended claims.

I claim:

1. A method of fault detection in a substrate support assembly in a semiconductor processing apparatus, the method comprising:
arranging a semiconductor substrate on the substrate support assembly;
supplying power to a plurality of heater zones of a heating plate of the substrate support assembly via a plurality of power supply lines such that power is supplied to each of the heater zones independently of power supplied to others of the heater zones;
obtaining a measured total heating power of the power provided by the plurality of heater zones by independently determining a respective heating power provided by each of the plurality of heater zones and calculating a sum of the respective heating powers;
comparing the measured total heating power to a pre-established total heating power of the plurality of heater zones; and
if the measured total heating power deviates from the pre-established total heating power by a pre-determined margin, triggering an alarm signal;
wherein the measured total heating power is obtained by measuring a voltage V across each of the one or more heater zones, measuring a current I flowing through each of the one or more heater zones, multiplying V by I, and adding V·I of each of the one or more heater zones.

2. The method of claim 1, wherein the pre-determined margin is ±20%, ±10%, ±5%, or ±1% of the pre-established total heating power.

3. The method of claim 1, wherein the voltage V is measured using a voltmeter and the current I is measured using an ammeter.

4. The method of claim 1, wherein (a) wherein each heater zone is connected to one of the power supply lines and one of a plurality of power return lines, and no two heater zones share the same pair of power supply line and power return line and (b) while one or more power supply lines are connected to a power source, and at least one power return line is connected to an electrical ground, the measured total heating power of the heater zones connected to the plurality of power supply lines and the plurality of power return lines is obtained by measuring a voltage V on the plurality of power supply lines, and measuring a total current I carried by the plurality of power return lines, and multiplying V by I; and the pre-established total heating power is calculated by summing a pre-established heating power of each of the heater zones connected to the plurality of power supply lines and the plurality of power return lines.

5. The method of claim 1, wherein (a) each of the heater zones is connected to one of the power supply lines and one of a plurality of power return lines, and no two heater zones share the same pair of power supply line and power return line and (b) while the plurality of power return lines are connected to an electrical ground, and at least one power supply line is connected to a power source, the measured total heating power of the heater zones connected to the plurality of power return lines and the plurality of power return lines is obtained by measuring a voltage V on the plurality of power return lines, measuring a current I on the plurality of power return lines, and multiplying V by I; and the pre-established total heating power is calculated by summing a pre-established heating power of each of the heater zones connected to the plurality of power return lines and the plurality of power return lines.

6. The method of claim 4, wherein the voltage V on the plurality of power supply lines is corrected by subtracting voltage drop that is not on a heater zone.

7. The method of claim 5, wherein the voltage V on the plurality of power return lines is corrected by subtracting voltage drop that is not on a heater zone.

8. The method of claim 1, wherein the plurality of heater zones to which power is supplied comprises at least two heater zones.

9. The method of claim 1, wherein the alarm signal triggers a recalibration test or a power adjustment to one or more of the plurality of heater zones.

10. The method of claim 1, wherein each of the plurality of heater zones is connected to a voltmeter and an ammeter and wherein the measured total heating power is obtained based upon values measured by the voltmeter and ammeter connected to each of the plurality of heater zones.

11. The method of claim 1, wherein the heater zones are powered by one or more heater elements, the heater elements each having a heating power of less than 20 Watts.

12. The method of claim 1, wherein the heater zones are arranged in an N-by-M array.

13. The method of claim 1, wherein the substrate support assembly includes a lower RF electrode.

14. The method of claim 1, wherein the power is supplied to one or more of the heater zones by a multiplexor connected to the power supply lines.

* * * * *